April 16, 1957 E. J. SPERBER 2,788,668

TUNING CONTROL MECHANISM FOR MULTIPLE RANGE RECEIVERS AND THE LIKE

Filed Dec. 1, 1953 3 Sheets-Sheet 1

INVENTOR.
Edward J. Sperber

BY H. L. Newton
ATTORNEY

INVENTOR.
Edward J. Sperber
BY H. L. Newton
ATTORNEY

April 16, 1957 E. J. SPERBER 2,788,668

TUNING CONTROL MECHANISM FOR MULTIPLE RANGE RECEIVERS AND THE LIKE

Filed Dec. 1, 1953 3 Sheets-Sheet 3

INVENTOR.
Edward J. Sperber

BY H. L. Newton

ATTORNEY

United States Patent Office 2,788,668

Patented Apr. 16, 1957

2,788,668

TUNING CONTROL MECHANISM FOR MULTIPLE RANGE RECEIVERS AND THE LIKE

Edward J. Sperber, Philadelphia, Pa., assignor to Radio Corporation of America, a corporation of Delaware Application December 1, 1953, Serial No. 395,451

11 Claims. (Cl. 74—10.45)

This invention relates to manual control mechanisms for signal selecting apparatus, and more particularly to manual tuning control mechanisms for radio and television receivers to adjust the variable tuning elements thereof for response to any one of a plurality of predetermined signal frequencies in a relatively wide band or differing bands.

Wide range or multi-range radio signal receiving equipment and in particular, television receivers, are generally difficult to tune accurately to any particular signal frequency or television channel due to the large frequency range to be covered by the tuning system and the generally limited mechanical movement of the manually movable control elements thereof. A small displacement of the tuning control elements of a receiver may result in a wide frequency change covering several channels. It has, therefore, been necessary in television and high frequency tunable radio apparatus to provide relatively slow motion drive or vernier control means between a main manual operating control element and the tuning elements actuated thereby to enable precise tuning to a particular signal frequency or channel.

This tuning problem has become much greater in connection with commercial television receivers wherein the frequency range has been extended by the allocation of some seventy additional channels in the ultra-high frequency (U.-H.-F.) band from 470 megacycles (mc.) to 890 mc. in addition to the twelve channels presently assigned in the very high frequency (V.-H.-F.) band in the 54 to 216 mc. range.

From a commercial standpoint, it is advantageous to provide separate U.-F.-F. and V.-H.-F. tuning units for television receivers. Because of the tuning difficulties hereinbefore mentioned, each tuner should have a main tuning control element and a vernier tuning control element. It is also desirable in television receivers to provide as few front panel control means for the tuning units as possible, so that average users may easily tune them to the various desired signal channels without extensive instruction.

It is accordingly a principal object of this invention to provide an improved manual tuning control system or mechanism for accurately controlling movable radio and television signal selecting elements in a receiver or similar apparatus, in a simple and a convenient manner.

It is an additional object of the invention to provide an improved manually operable tuning mechanism for a pair of high frequency signal tuning units and associated vernier or fine tuning control means therefor which may be controlled by common driving elements.

Another object of this invention is to provide a manual tuning control mechanism for relatively wide range high frequency signal circuits which provides selective tuning movement of the movable tuning elements thereof while at the same time providing vernier tuning control for any selected narrow signal channel.

It is a further object of the invention to provide a tuning control mechanism which provides movement of a plurality of tuning elements to cover a predetermined frequency range, including a pair of distinct and separated frequency bands, and which imparts such movement through the rotation of common manually movable tuning control elements.

A manual tuning control system in accordance with the invention, includes a mechanism for rapidly operating selectively one or the other of two receiver tuners and for vernier tuning operation over a relatively narrow channel within the frequency band of either of the tuners. Such a mechanism is useful in tuning receivers incorporating two tuners as described above, to cover different frequency bands.

As applied to television receivers, the tuning mechanism of the present invention is provided with a pair of manually controllable shafts preferably arranged in concentric relation to each other. The first shaft may have twelve V.-H.-F. positions (channels 2–13) and one U.-H.-F. spaced over 360° rotation of the shaft. When the first shaft is in any of the V.-H.-F. positions, the mechanism couples the second shaft to the V.-H.F. fine tuning control means. When the first shaft is in the U.-H.-F. position, means such as an actuating cam automatically shift the second shaft from the V.-H.-F. fine tuning control means to drive the U.-H.-F. tuning control element.

The first shaft is continuously rotatable in either direction for ease in channel and range selection. As will further be shown hereinafter, the second control shaft may be rotated to change the V.-H.-F. vernier or fine tuning without disturbing the previous setting of the U.-H.-F. tuner, and vice versa. This is an added convenience because after the U.-H.-F. tuner is tuned to a desired channel, and the receiver is later tuned to a V.-H.-F. channel, reselection of the former U.-H.-F. channel is made by merely switching the first shaft to the U.-H.-F. position.

It is accordingly an object of this invention to provide an improved tuning control mechanism for a television receiver having separate U.-H.-F. and V.-H.-F. tuning units and associated vernier tuning elements in which the tuning of one unit does not cause change in the previous tuning of the other unit.

It is still a further object of this invention to provide in a high frequency signal translating apparatus, a compact and simplified control mechanism for the tuning elements of a pair of high frequency tuners, wherein tuning control is provided by a pair of rotatable tuning control shafts, one of which is continuously rotatable in steps and the other of which may be moved independently through any predetermined angle continuously or in steps as desired.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
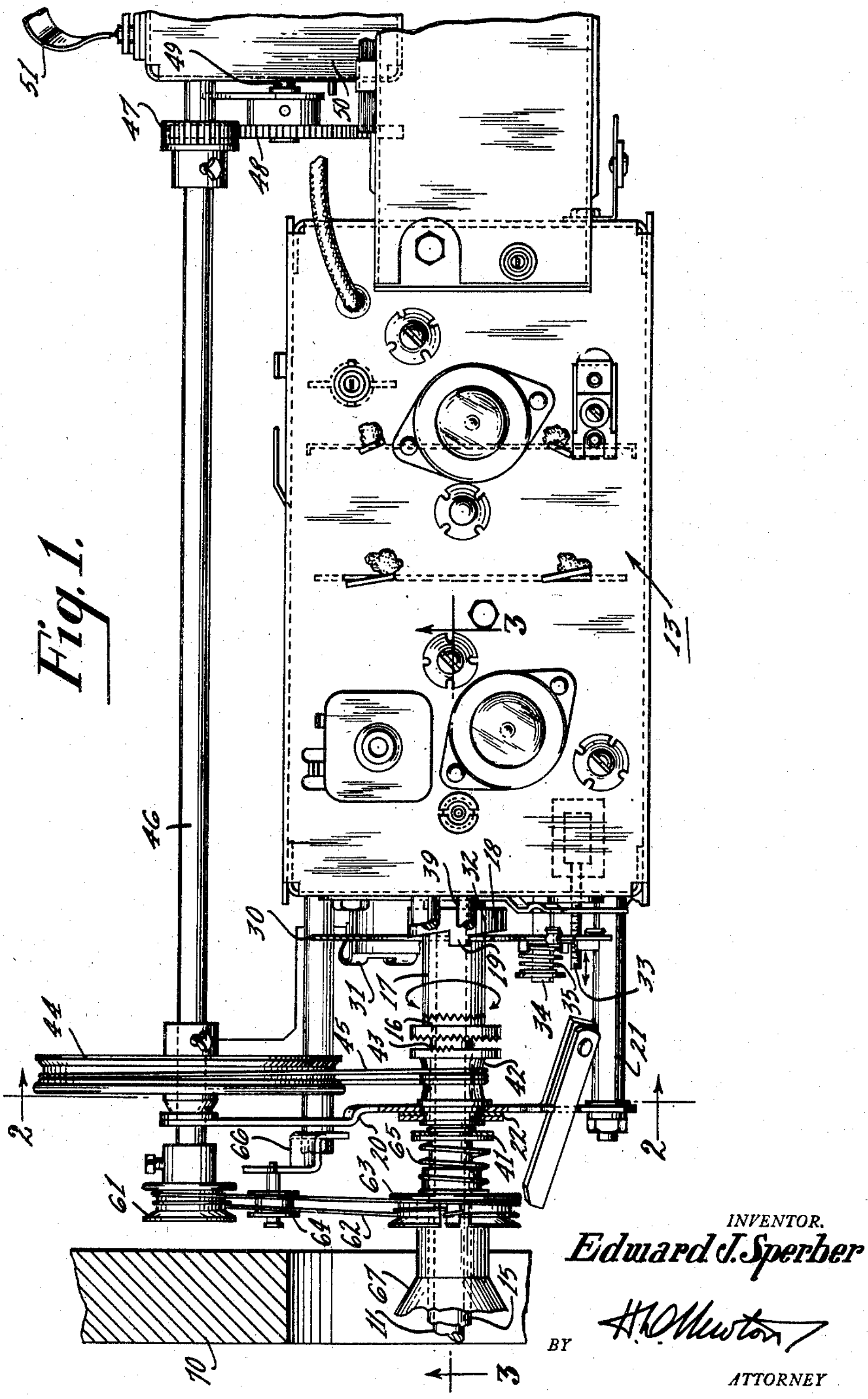
Figure 1 is a top view, partly broken away, of a two-unit television tuning system provided with a tuning control mechanism in accordance with the invention, and with the said mechanism conditioned for V.-H.-F. tuning control.
Figure 2:
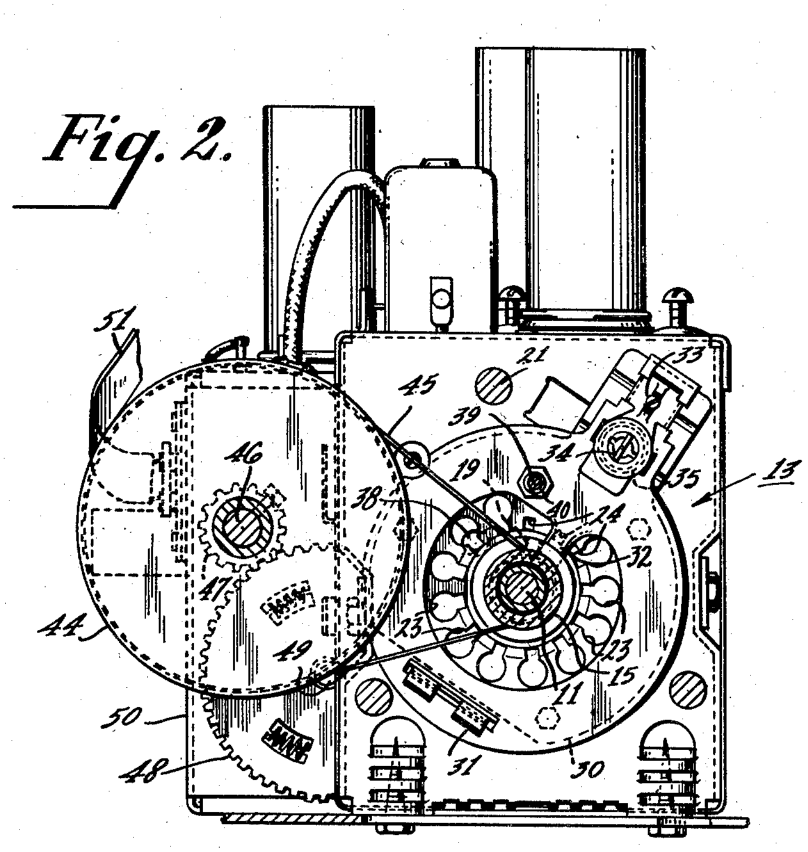
Figure 2 is a front elevational view, partly in section, of the tuning system and tuning control mechanism shown in Figure 1, the section being taken on the line 2—2 of Figure 1, looking in the direction of the arrows.
Figure 4A:
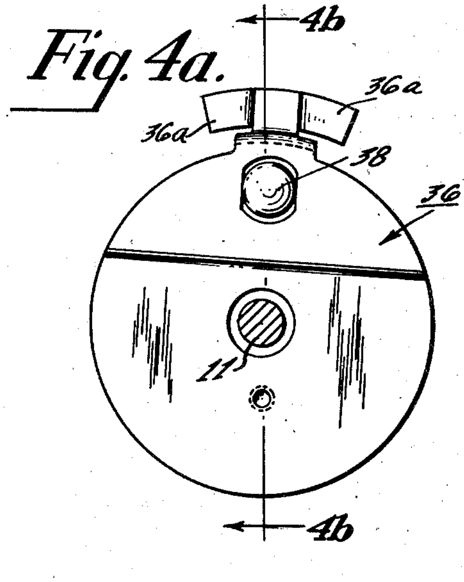
Figure 4B:
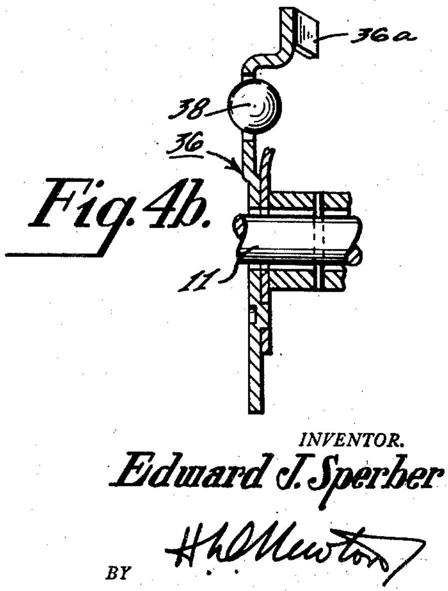
Figure 5:
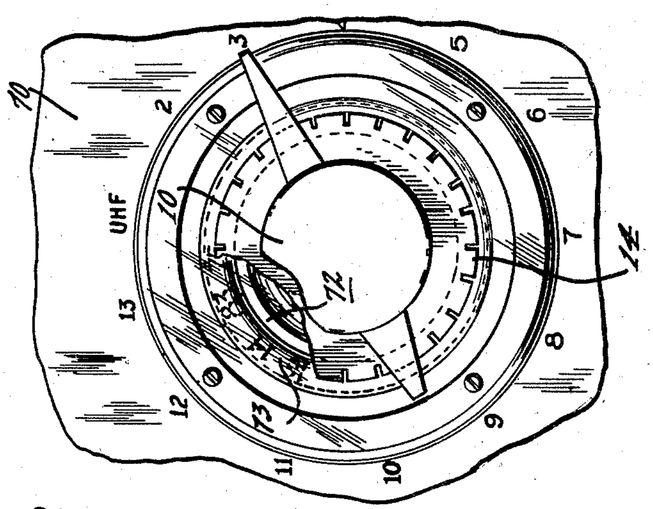
Figure 3:
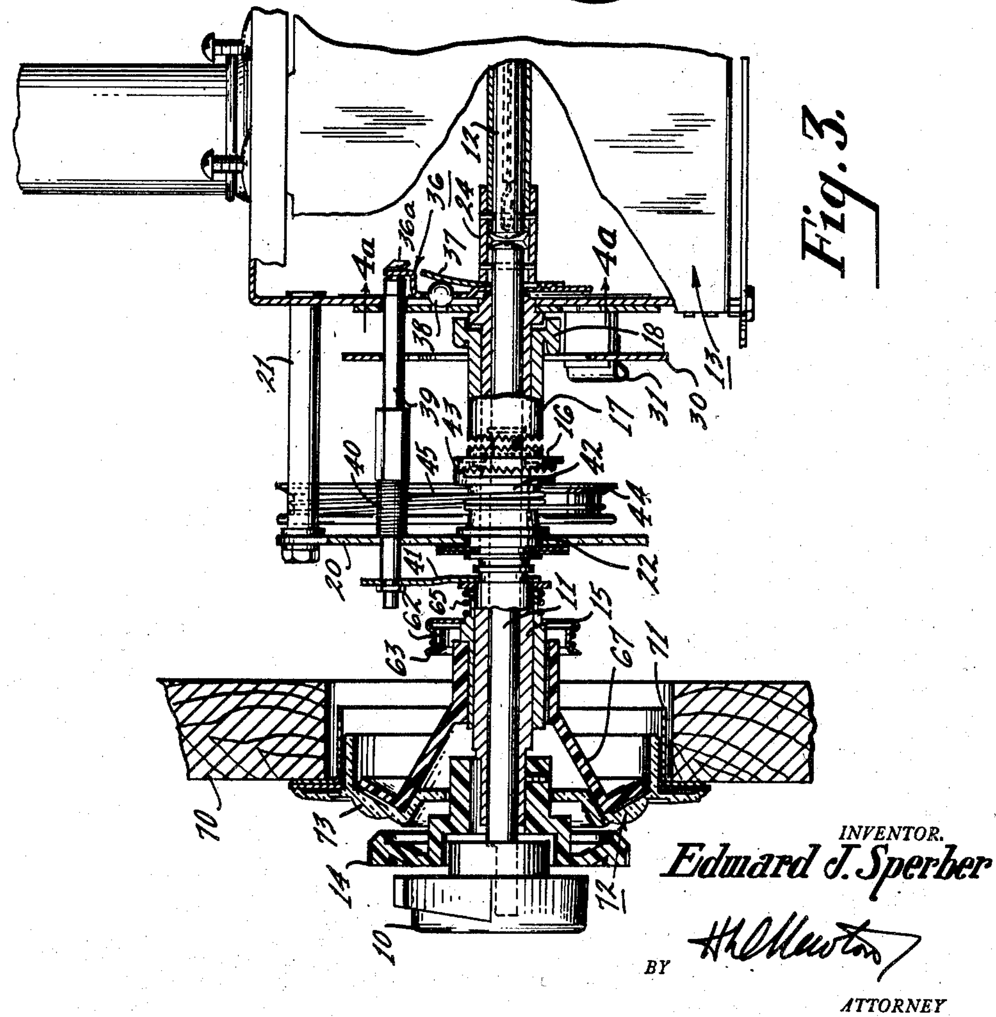
Figure 3 is a side view, partly in section, of the tuning system and mechanism of Figure 1, this section being taken on the line 3—3 of Figure 1, looking in the direction of the arrows and the mechanism being conditioned for U.-H.-F. tuning control.

Figures 4*a* and 4*b* are front and side views, respectively, of certain U.-H.-F. actuating members of the tuning control mechanism of Figures 1, 2, and 3, showing constructional details thereof; and Figure 5 is an enlarged front panel view of the tuning control mechanism of Figure 3, showing further features of the invention.

Referring now to the drawings wherein like reference characters are used to designate like components or equivalents thereof in the different figures, and referring particularly to Figures 1 to 3, a control knob 10 is securely fastened for rotation with a main tuning control or drive shaft 11. The shaft 11 is fixedly coupled through a collar 24 to a rotary tuning shaft 12 for a very high frequency (V.-H.-F.) tuner 13. Naturally the tuning shaft 12 and the control shaft 11 could be constructed as a single shaft, however, the two piece construction is preferably in some instances to facilitate assembly of the unit. The V.-H.-F. tuner 13 may be of any suitable type having a rotary control shaft, but is preferably of the conventional step-by-step rotary shaft type and may be assumed to be of this type by way of example.

A tuner constructed in accordance with the invention, may have, for example, detent means connected with the control shaft 11 or the tuning shaft 12 for defining thirteen stop positions, for example, through one revolution of the knob 10. Twelve of these positions may correspond to the V.-H.-F. television channels 2–13, and the thirteenth position may be selected to condition or set the tuning mechanism for ultra-high frequency operation, as will hereinafter be described.

The fine tuning control for the very high frequency tuner 13 may be provided by any conventional means such as, for example, an auxiliary small variable capacitor. The type of capacitor which is presently used in the apparatus shown comprises a fixed cylindrical electrode and an axially movable core electrode therein. The capacitance may be varied by movement of the core which in the present example is controlled by the fine or vernier control knob 14. The knob 14 is securely fastened on one end of an axially movable and rotatable shaft 15 which is a second tuning control or drive shaft and is concentrically mounted on the main tuning control shaft 11. The other end of the shaft 15 is provided with a clutch member 16 which is of enlarged diameter with respect to the shaft and has teeth on the opposite faces thereof for transmitting rotational motion of the knob 14 to a desired cooperating clutch face depending on the axial position of the shaft 15. When the main tuning control shaft 11 is rotated to a V.-H.-F. position the shaft 15 is spring biased so that one face of the clutch member 16 is urged against a cooperative toothed clutch face of a V.-H.-F. vernier coupling shaft 17.

A collar having a cam surface 18 is provided on one end of the coupling shaft 17. A frame member or yoke 30, which is pivotally mounted on a hinge 31, has a cam follower 32 (best shown in Figure 3), which rides on the cam surface 18 to control the pivotal movement of the frame 30.

The fine tuning control capacitor core is fastened for axial movement to a rod 33 which is securely fastened to an end of the frame or yoke 30 opposite the pivot point or hinge 31. Upon rotation of the knob 14 the frame 30 pivots on the hinge 31 causing axial movement of the rod 33 and the tuning core to provide the necessary fine tuning. As shown in Figure 1 the rod 33 may be provided with threads so that it may be turned in or out of the yoke 30 to provide a predetermined index setting of the fine tuning control core.

A stud or arm 34 which is mounted on the V.-H.-F. tuner housing, supports a spring member 35 which urges the frame 30 toward the tuner 13 housing so that the cam follower 32 is always spring biased against the cam surface 18 to insure precise control of the movement of the yoke 30. A stop 19 on the cam surface 18 prevents the vernier coupling shaft 17 from rotating more than 360° and, hence, gives some indication of the limits of the fine tuning control. It is understood that a rotatable fine tuning control element could be used by providing simple gearing means between the coupling shaft 17 and said rotatable fine tuning control element.

A bracket plate 20 is supported in spaced relation to and parallel with the front surface of the tuner 13 housing by a set of columns 21 which are mounted directly on the V.-H.-F. tuner 13 housing. A bearing surface 22 is provided in the bracket plate 20 to provide support for the tuning control shafts 11 and 15. A plurality of access holes 23 are provided in the bracket plate 20 and the front plate of the tuner 13 concentric with the shafts 11 and 15 so that screwdriver adjustments may be made on the V.-H.-F. tuner without disassembling the entire unit.

For tuning the U.-H.-F. range, the knob 10 is turned to the aforementioned thirteenth or U.-H.-F position to condition the mechanism to connect the knob 14 with the tuning element of a U.-H.-F. tuner 50.

As shown in Figures 3, 4*a* and 4*b*, a cam member 36 is securely fastened for rotation with the main tuning shaft 11. When the knob 10 is turned to the U.-H.-F. position the shaft 11 and the cam member 36 are brought into a position where the cam 36 bears against one end of an axially movable spring loaded thrust rod 39. The cam 36 has a pair of wings or arms **36*a* which are bent back so that the end of the thrust rod 39** will ride up the wing, and ride out against the spring loading.

Detent means for the tuning system is provided by a ball-bearing 38 which is located in an aperture of the cam member 36 and is urged against the front plate of the tuner by a leaf spring 37. A series of rectangular cooperating apertures 25 are cut in the front surface of the V.-H.-F. tuner housing corresponding to the various V.-H.-F. channel settings and the U.-H.-F. setting. The bearing member 38 is forced into the cooperating apertures to insure accurate reset alignment of the tuning shaft 12. In the U.-H.-F. position the ball-bearing 38 insures alignment of the cam member 36 and the thrust rod 39.

The thrust rod 39 extends through the bracket plate 20 and is rigidly coupled with the axially movable shaft 15 by means of an arm 41 so that the shaft 15 will be moved into one of two positions dependent on the position of the rod 39. The thrust rod 39 is surrounded by a spring 40 which is compressed between the bracket plate 20, and a raised portion on the rod to spring bias the rod toward the tuner housing and, hence, the vernier tuning control shaft 15 toward the vernier coupling shaft 17.

In the ultra-high frequency position of knob 10 the clutch 16 is moved by the action of the cam 36 and the thrust rod 39 to the position shown in Figure 3 wherein one toothed face of the clutch member 16 is in driving relation with a corresponding toothed clutch face of an ultra-high frequency pulley 42. As may be best seen by reference to Figure 1, the ultra-high frequency driving pulley 42 is rotatably mounted on the shaft 15 and is coupled by means of a belt 45 to a larger pulley 44 which drives the U.-H.-F. tuner 50. Due to the relative sizes of the pulleys, a relatively large rotation of the knob 14 is required to move the tuning element of the ultra-high frequency tuner 50 a relatively smaller amount, hence, enabling easier accurate tuning. The pulley 44 is rigidly fastened by a set screw or the like near one end of a shaft 46 which rotates in bearings provided by the bracket plate 20 and the front surface of the U.-H.-F. tuner 50 housing. A gear 47 is fastened near the other end of the shaft 46 to mesh with and drive a scissors gear 48. The scissors gear 48 is mounted on the rotatable tuning shaft 49 of the ultra-high frequency tuner 50.

The ultra-high frequency tuner 50 may be of any well known type such as, for instance, one having a variable capacitor as the tuning element thereof and is preferably continuously tunable over the desired U.-H.-F. range.

An indicating dial 67 is provided for showing the U.-H.-F. channel selection of the U.-H.-F. tuner 50. The indicating dial is rotatably mounted on the shaft 15 and is biased against an escutcheon 72 by a spring 65. A pulley 63 is fastened as a part of the rear of the dial 67 and is conneced by a belt 62 to a pulley 61 which is fastened for rotation with the shaft 46. A pulley 64 is provided intermediate the pulleys 61 and 63 to keep the belt member 62 taut.

The pulley 64 is rotatably mounted on a pin which is supported by a bracket arm 66. The bracket arm 66 is fastened on the bracket plate 20 by means of one of the fastening nuts on the end of the supporting rods 21, and is rotatable to provide the desired amount of tension on the belt 62.

The size of the pulleys 61 and 63 are selected so that the indicating dial 67 will be rotated through one revolution while the U.-H.-F. tuner is tuned over its entire frequency range. Thus the dial calibrations corresponding to channels 14–83 may be spread around the periphery of the dial 67 to correctly indicate the channel to which the U.-H.-F. tuner is tuned. The dial 67 will only be rotated by the rotation of the shaft 46.

As shown in Figures 3 and 5 the tuning knobs 10 and 14 project through a suitable aperture in the receiver cabinet 70. A supporting and centering ring 71 is fitted into the aperture to provide a base member on which the escutcheon 72 may be fabricated of a Lucite or other transparent material so that the dial calibrations on the ultra-high frequency indicating dial 67 may be viewed therethrough. As shown in the drawings, a convex portion 73 may be provided over the index marks on the escutcheon to magnify these calibrations on the indicator dial 67. The V.-H.-F. channel indices may be affixed in any suitable location, such as on the receiver cabinet 70 as shown.

In operation the aforedescribed mechanism provides many advantages to enable simplified operation by the average television viewer. The knob 10 is continuously rotatable in either direction. Thus any of the twelve V.-H.-F. positions or the U.-H.-F. position may quickly be selected, and in switching from U.-H.-F. operation, either of channels 2 or 13 may be immediately selected as desired. In some prior devices if the receiver were tuned to the U.-H.-F. channel 83, and it was desired to tune to channel 2, it was necessary to tune back through the entire U.-H.-F. and V.-H.-F. range from channel 83 to channel 2.

Furthermore, it is possible that in some locations there may be only one U.-H.-F channel which may acceptably be received. As hereinbefore described, the knob 10 is set to the U.-H.-F. position and the knob 14 is then rotated to select the U.-H.-F channel. If the knob 10 is switched to a V.-H.-F. channel and knob 14 is rotated to provide the desired fine tuning, the U.-H.-F. channel selection is not disturbed. To retune to the U.-H.-F. channel the knob 10 is merely switched back to the V.-H.-F. position and without further adjustment the receiver is properly tuned. The reverse, of course, is also true, that is by changing the U.-H.-F. tuning, the V.-H.-F. fine tuning control is not disturbed.

This mechanism also provides many commercial advantages in the relatively few parts required and the resulting advantages of low material and labor cost.

The constructional simplicity as might be deduced, has resulted in a virtually trouble-free operation in commercial use, and not only provides a saving in weight and space, and money, but enables a greatly simplified receiver control.

From the foregoing description, it is evident that the invention provides a simplified tuning mechanism for operating a pair of tuners for radio and television receivers or the like from common manually operable driving members. It is further evident that the tuning mechanism in accordance with the invention may have common driving members capable of full 360° rotation and provide coarse and fine tuning control for a pair of such tuners. Also the operation of one tuner does not cause change in the tuning adjustment of the other. The embodiment of the invention as shown and described is meeting a wide demand for an effective V.-H.-F. and U.-H.-F. tuning control that is applicable to present day commercial television receivers for home use and the like.

What is claimed is:

1. In a wide band signal receiving system having at least two high frequency tuners with individual movable tuning control means, a mechanical tuning control system therefore comprising in combination, a pair of control shafts, means for connecting said control shafts with the movable tuning control means of one of said tuners, further means including one of said shafts for shifting the connection of the other of said shafts from the movable tuning control means of said one tuner to the movable tuning control means of the other of said tuners whereby the tuning control means of said tuners may selectively be moved for tuning said signal receiving system over a wide range of frequencies.

2. A manual tuning control mechanism for selectively actuating a pair of high frequency signal tuners comprising in combination, a main tuning control means for each of said tuners, a vernier tuning control means for one of said tuners, first and second tuning drive shafts, said first shaft being connected with the main tuning control means of one of said tuners, movable coupling means mounted on said second shaft, means for moving said coupling means to couple with said vernier tuning control means, further means for moving said coupling means to couple with the main tuning control means of the other of said tuners and decouple from said vernier tuning control means, whereby the main tuning control means of said tuners may selectively be moved for tuning said signal receiving system over a wide range of frequencies.

3. A manual tuning control mechanism as defined in claim 2, wherein the coupling means is moved to couple with the main tuning control means of the other of said tuners and to decouple from said vernier tuning control means by operation of said first drive shaft to a predetermined position of rotation.

4. A manual tuning control mechanism for selectively actuating a pair of high frequency tuners comprising in combination, a main tuning control means for each of said tuners, vernier tuning control means for one of said tuners, first and second tuning drive shafts disposed in concentric relation, said first shaft being connected with the main tuning control means of one of said tuners, clutch means coupling said second shaft with said vernier tuning control means for transmitting movement of said second shaft to said vernier tuning control means, further means for axially moving said second shaft to operate said clutch means to couple said second shaft with the main tuning control means of the other of said tuners whereby tuning control movement of said second shaft is transmitted selectively to said main tuning control element and to said vernier tuning control means.

5. A manual tuning control mechanism as defined in claim 4, wherein said further means for axially moving said second shaft comprises a mechanical linkage connected with said second shaft, cam means fastened for rotation with said first shaft, said mechanical linkage disposed in the path of movement of said cam means whereby said second control shaft is axially moved over a predetermined portion of movement of said cam and said first control shaft.

6. A manual tuning control mechanism as defined in claim 4, wherein said clutch member has oppositely disposed clutch faces for selective engagement with said vernier tuning control means or the main tuning control means of said other tuner.

7. In a wide band signal receiving system having at least two high frequency tuners with individual movable tuning control means, and a vernier tuning control means for at least one of said tuners, a mechanical tuning control system comprising in combination, a pair of control shafts, means for connecting one of said control shafts with the movable tuning control means of one of said tuners, means connecting the other of said control shafts with said vernier tuning control means including a collar on said second shaft having a cam surface, a pivotally mounted yoke member having a cam follower for riding on said cam surface, means for connecting said vernier tuning control means with said pivotally mounted yoke whereby movement of said second shaft is transmitted to said vernier tuning control means, further means for shifting the connection of said second shaft to the movable tuning control means of the other of said tuners.

8. A tuning system for radio receivers and the like comprising in combination, a first tuner having a movable frequency control element, first manually operable means to move said element for tuning purposes, fine tuning control means for said first tuner, second manually operable means to move said fine tuning control means, a second high frequency tuner having a movable frequency control element, and means connected with and actuated by said first manually operable means to mechanically connect said second manually operable means to move the frequency control element of said second tuner.

9. In a television receiver having a step-by-step very high frequency (V.-H.-F.) tuner and a continuously tunable ultra-high frequency (U.-H.-F.) tuner each with individual rotatable tuning control means, and vernier tuning control means for said V.-H.-F. tuner, a mechanical control system for said tuning control means comprising in combination, a first rotatable drive shaft connected with the tuning control means of said V.-H.-F. tuner, a second axially movable and rotatable shaft mounted in concentric relation with said first shaft, a clutch member mounted on one end of said second shaft having oppositely disposed clutch faces, a vernier drive shaft connected for moving said vernier tuning control means rotatably mounted for engagement with one of said clutch faces, a rotatably mounted pulley having a clutch portion disposed for engagement with the other of said clutch faces, belt driving means connecting said pulley with the tuning control means of said U.-H.-F. tuner, a mechanical linkage including a thrust rod connected with said second shaft, means for moving said linkage comprising an actuating cam fastened for rotation with said first drive shaft, said cam positioned for engagement with said thrust rod in a predetermined portion of the rotation of said second shaft for axially moving said shaft for selective engagement with said pulley or said vernier drive shaft.

10. In a television receiver the combination as defined in claim 9, having U.-H.-F. station indicator means including a dial member rotatably mounted on said second shaft, a second pulley connected with said dial member, a third pulley connected with said U.-H.-F. tuning control means, and belt drive means connecting said pulleys to rotate said dial for indicating the angular displacement of said U.-H.-F. tuning control means.

11. A manual tuning control system for high frequency signal circuits comprising in combination, a first high frequency tuner, first and second manually rotatable tuning drive shafts, a main tuning control means and a fine tuning control means for said tuner, means coupling the first drive shaft to said main tuning control means and the second drive shaft to said fine tuning control means, a second high frequency tuner, a main tuning control means for said second tuner, and means including said first drive shaft for mechanically decoupling said fine tuning control means from said means coupling said second drive shaft to said fine tuning control means, and mechanically coupling said second drive shaft to said main tuning control means for said second tuner.

References Cited in the file of this patent

UNITED STATES PATENTS 1,605,804 Asbury ---------------- Nov. 2, 1926